(12) United States Patent
Almaguer et al.

(10) Patent No.: US 12,167,554 B2
(45) Date of Patent: Dec. 10, 2024

(54) DISPLAY CASE DOOR WITH DOOR FRAME ELECTRICAL CONNECTION

(71) Applicant: Anthony, Inc., Sylmar, CA (US)

(72) Inventors: Pedro Almaguer, North Hills, CA (US); Adrian Rodriguez, Santa Clarita, CA (US); Jose Caloca, Sylmar, CA (US); Mark Sandnes, Granada Hills, CA (US); Dexter Maluto, Los Angeles, CA (US)

(73) Assignee: Anthony, Inc., Sylmar (CA)

( * ) Notice: Subject to any disclaimer, the term of this patent is extended or adjusted under 35 U.S.C. 154(b) by 122 days.

(21) Appl. No.: 17/967,156

(22) Filed: Oct. 17, 2022

(65) Prior Publication Data
US 2024/0122375 A1    Apr. 18, 2024

(51) Int. Cl.
*H05K 5/02* (2006.01)
*A47F 3/04* (2006.01)

(52) U.S. Cl.
CPC .......... *H05K 5/0247* (2013.01); *A47F 3/0434* (2013.01)

(58) Field of Classification Search
None
See application file for complete search history.

(56) References Cited

U.S. PATENT DOCUMENTS

| | | | |
|---|---|---|---|
| 4,248,489 A * | 2/1981 | Barroero | F25D 23/02 49/70 |
| 4,671,582 A * | 6/1987 | Stromquist | E05D 7/081 439/31 |
| 6,298,615 B1 * | 10/2001 | Richardson | A47F 3/043 49/504 |
| 9,052,536 B2 * | 6/2015 | Artwohl | A47F 10/02 |
| 9,155,405 B2 * | 10/2015 | Artwohl | G09G 3/003 |
| 10,704,826 B2 * | 7/2020 | Lee | A47F 3/0434 |
| 2014/0203699 A1 * | 7/2014 | Pack | F25D 23/028 312/405 |
| 2018/0146797 A1 * | 5/2018 | Artwohl | A47F 3/0434 |
| 2019/0050900 A1 | 2/2019 | Avakian | |
| 2019/0122263 A1 | 4/2019 | Avakian | |
| 2020/0256612 A1 | 8/2020 | Avakian et al. | |
| 2020/0300538 A1 | 9/2020 | Avakian et al. | |
| 2021/0041161 A1 | 2/2021 | Avakian | |
| 2021/0366005 A1 | 11/2021 | Avakian et al. | |

FOREIGN PATENT DOCUMENTS

| | | |
|---|---|---|
| WO | WO 2019/032893 | 2/2019 |
| WO | WO 2020/131881 | 6/2020 |
| WO | WO 2021/150406 | 7/2021 |

OTHER PUBLICATIONS

Hussmann, "Innovator Aluminum Door System for Walk-In Coolers," Installation & Service Manual, P/N 2402130_E, Nov. 2013, 34 pages.

* cited by examiner

*Primary Examiner* — Joshua K Ihezie
(74) *Attorney, Agent, or Firm* — Fish & Richardson P.C.

(57) ABSTRACT

A display case door that includes a frame around at least a portion of the display case door with an electrical connection installed within the frame. The electrical connector includes at least one opening defined within a surface of the electrical connector corresponding with at least one female electrical terminal. The electrical connector is mounted inside the door frame and the surface of the electrical connector is aligned with an opening in a sidewall of the door frame.

7 Claims, 9 Drawing Sheets

DISPLAY CASE DOOR WITH DOOR FRAME ELECTRICAL CONNECTION

TECHNICAL FIELD

The present specification relates to thermally insulated doors for temperature-controlled embodiments.

BACKGROUND

Refrigerated enclosures are used in commercial, institutional, and residential applications for storing and/or displaying refrigerated or frozen objects. Refrigerated enclosures may be maintained at temperatures above freezing (e.g., a refrigerator) or at temperatures below freezing (e.g., a freezer). Refrigerated enclosures have one or more thermally insulated doors or windows for viewing and accessing refrigerated or frozen objects within a temperature-controlled space. Doors for refrigerated enclosures generally include thermally insulated glass panel assemblies.

Displaying content on refrigerated display case doors can be an effective way of advertising products. Refrigerated display case doors with embedded display panels can be costly and difficult to maintain. Improvement in the methods for displaying content in refrigerated display case doors are continuously sought

SUMMARY

This specification relates to a display case door including external power and/or data connections through a door frame. In general, innovative aspects of the subject matter described in this specification can be embodied in a display case door that includes a frame around at least a portion of the display case door with an electrical connection installed within the frame. The electrical connector includes at least one opening defined within a surface of the electrical connector corresponding with at least one female electrical terminal. The electrical connector is mounted inside the door frame and the surface of the electrical connector is aligned with an opening in a sidewall of the door frame. This and other implementations can each optionally include one or more of the following features.

In some implementations, the electrical connector is mounted to a hinge-side of the frame. In some implementations, the surface of the electrical connector is flush with an outer surface of the frame sidewall.

In some implementations, the display case door includes a transparent insulated panel assembly mounted to the frame. In some implementations, the display case door includes an insulated panel assembly mounted to the frame. In some implementations, the display case door includes a video display mounted to the frame and overlapping the insulated panel assembly.

In some implementations, the at least one female electrical terminal is connected to a power supply cable, and the electrical connector includes at least one second opening defined within the surface of the electrical connector corresponding with at least one second female electrical terminal that is connected to a data cable.

In some implementations, the frame comprises a U-shaped cross-section and the electrical connector is disposed within the U-shaped cross-section, and where the electrical connector is coupled to a sidewall of the frame by one or more mechanical fasteners.

In some implementations, the surface of the electrical connector is a front surface, and the electrical connector includes a power supply cable connected to the at least one female electrical terminal and extending out from a back surface of the electrical connector, the back surface on an opposite side of the electrical connector from the front surface.

A second general aspect can be embodied in a refrigerated display case that includes a case frame and a door mounted in the case frame. The door includes a door frame und at least a portion of the door and a female electrical connector installed within the door frame. The female electrical connector includes at least one opening defined within a surface of the female electrical connector corresponding with at least one female electrical terminal. The female electrical connector is mounted inside the door frame and the surface of the female electrical connector is aligned with an opening in a sidewall of the door frame. The case includes an electrical cable comprising a male electrical connector configured to connect to the female electrical connector. This and other implementations can each optionally include one or more of the following features.

In some implementations, the male electrical connector has a flattened shape comprising a thickness that is less than both a width and a height of the male electrical connector.

In some implementations, the male electrical connector includes a first surface with at least one electrical terminal extending outward therefrom, a second surface tangential to the first surface at a first edge with a power supply cable extending outward therefrom, and a third surface tangential to the first surface at a second edge, opposite the first edge, with a connection tab extending therefrom, where the connection tab is coupled to the sidewall of the door frame by at least one mechanical fastener.

In some implementations, the female electrical connector is mounted to a hinge-side of the door frame, and the surface of the female electrical connector is flush with an outer surface of the sidewall.

In some implementations, the door includes a transparent insulated panel assembly mounted to the door frame. In some implementations, the door comprises an includes a panel assembly mounted to the door frame. In some implementations, the door includes a video display mounted to door the door frame and overlapping the insulated panel assembly.

In some implementations, the at least one female electrical terminal is connected to a power supply cable, and the female electrical connector includes at least one second opening defined within the surface of the female electrical connector corresponding with at least one second female electrical terminal that is connected to a data cable. In some implementations, the male electrical connector includes at least one male electrical terminal connected to a second power supply cable, and at least one second male electrical terminal that is connected to a second data cable.

In some implementations, the door frame includes a U-shaped cross-section and the female electrical connector is disposed within the U-shaped cross-section, and the female electrical connector is coupled to a sidewall of the door frame by one or more mechanical fasteners.

In some implementations, the surface of the female electrical connector is a front surface, and the female electrical connector comprises a power supply cable connected to the at least one female electrical terminal and extending out from a back surface of the female electrical connector, the back surface on an opposite side of the female electrical connector from the front surface.

A third general aspect can be embodied in a refrigerated display case that includes a case frame and electrical cable and a door mounted in the case frame. The case frame includes a hole defined in a surface of the case frame and a first grommet installed around an edge the hole. The electrical cable extends through the first grommet and includes an electrical connector disposed at one end of the electrical cable. The door includes a door frame around at least a portion of the door. The door frame includes an opening defined within a sidewall of the door frame at a hinge-side of the door. The opening includes a second grommet and a steel cover installed around an edge of the opening. The electrical cable passes through the second grommet and into the door frame. The door frame includes a cable holder attached to an outer surface of the sidewall and spaced apart from the second grommet with the electrical cable secured to the sidewall by the cable holder.

Particular implementations of the subject matter described in this specification can be implemented so as to realize one or more of the following advantages. Implementations may create a more robust powered connection between door and frame which separates the electrical function away from the structural function. For example, some existing door structures rout electrical connections through door hinges. Implementations, may reduce risk of electrical arching due to mechanical wear or incorrect installation by separating electrical functions from structural functions of display case doors. By providing an electrical connection integrated into a door frame separate from a door structural support, e.g., a hinge, implementations disclosed herein may create safer and more robust electrical connections.

The details of one or more implementations of the subject matter described in this specification are set forth in the accompanying drawings and the description below. Other features, aspects, and advantages of the subject matter will become apparent from the description, the drawings, and the claims.

DESCRIPTION OF DRAWINGS

Like reference symbols in the various drawings indicate like elements.

DETAILED DESCRIPTION

Figure 1:
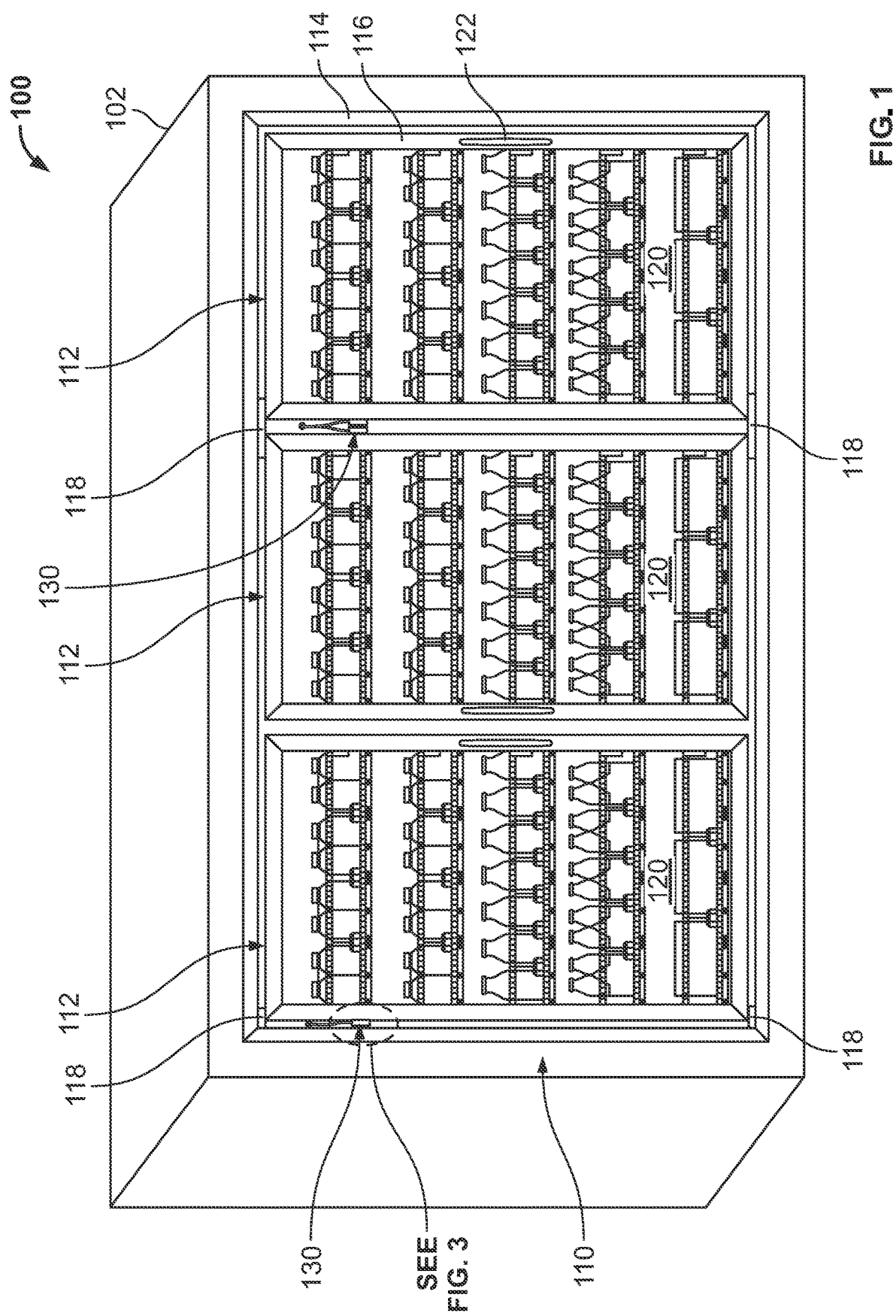
FIG. 1 depicts a perspective view of a refrigerated enclosure having multiple transparent doors.
Figure 2:
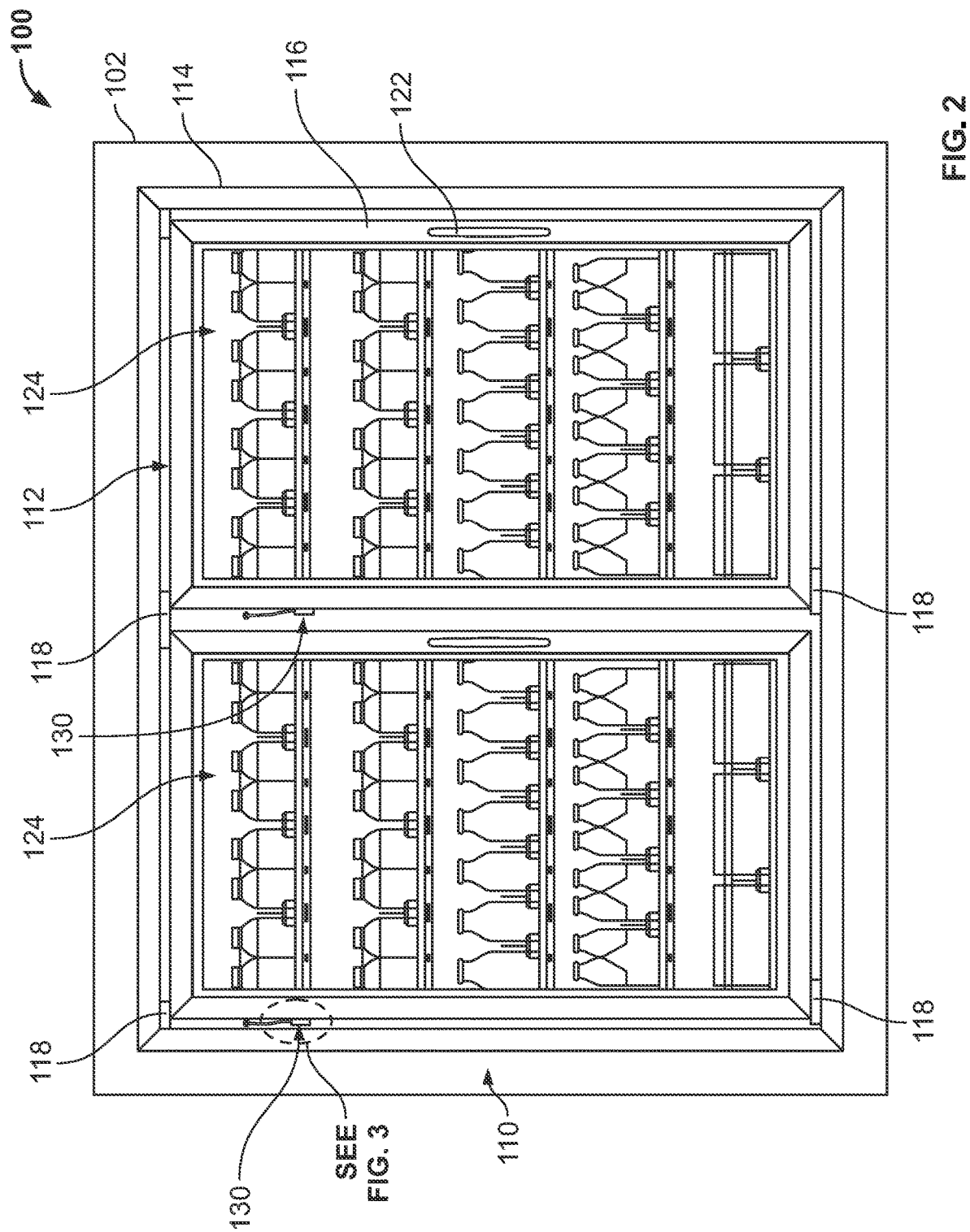
FIG. 2 depicts a perspective view of a refrigerated enclosure having multiple doors with video display screens.
Figure 3:
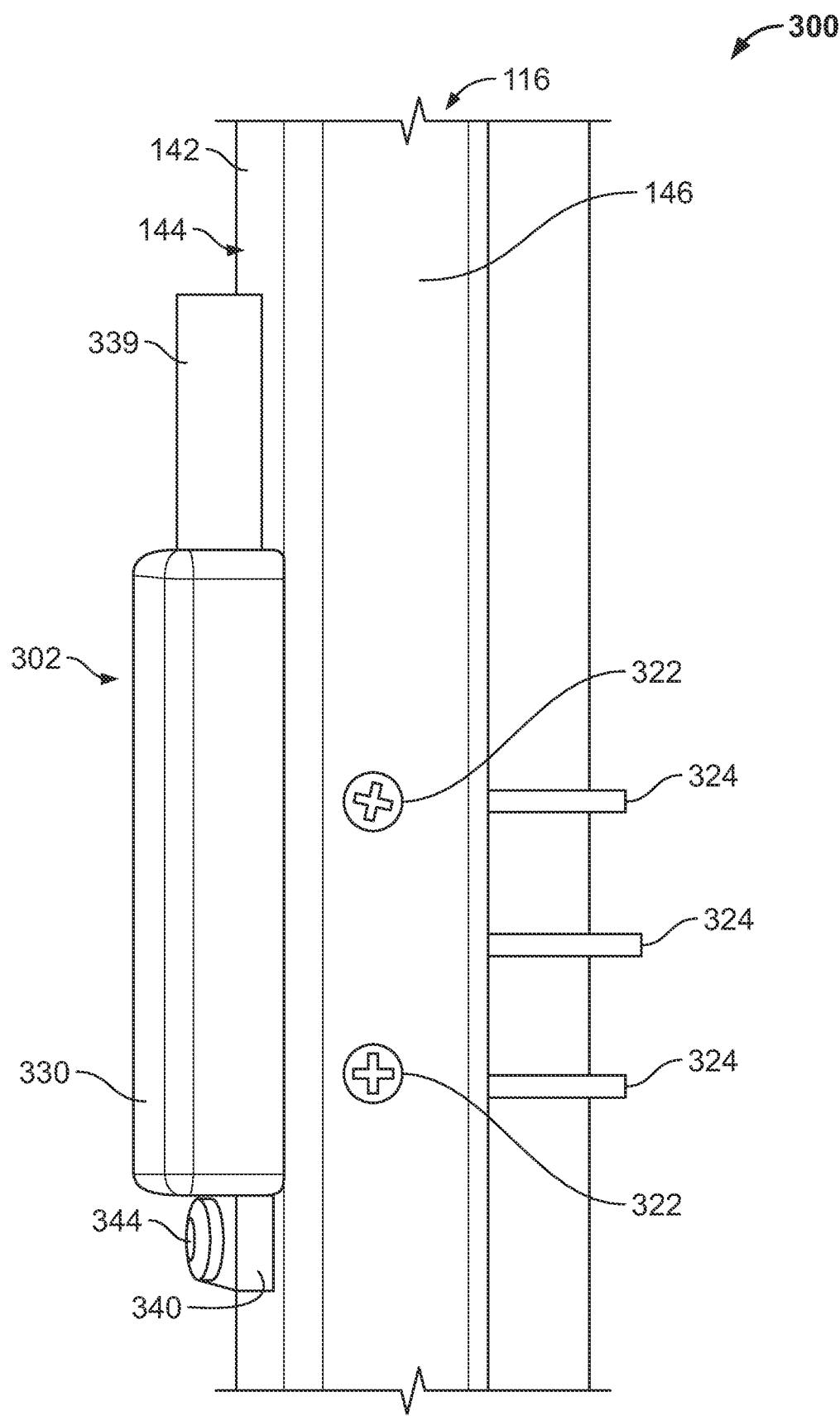
FIG. 3 depicts a detailed view of an exemplary door frame electrical connection.
Figure 4:
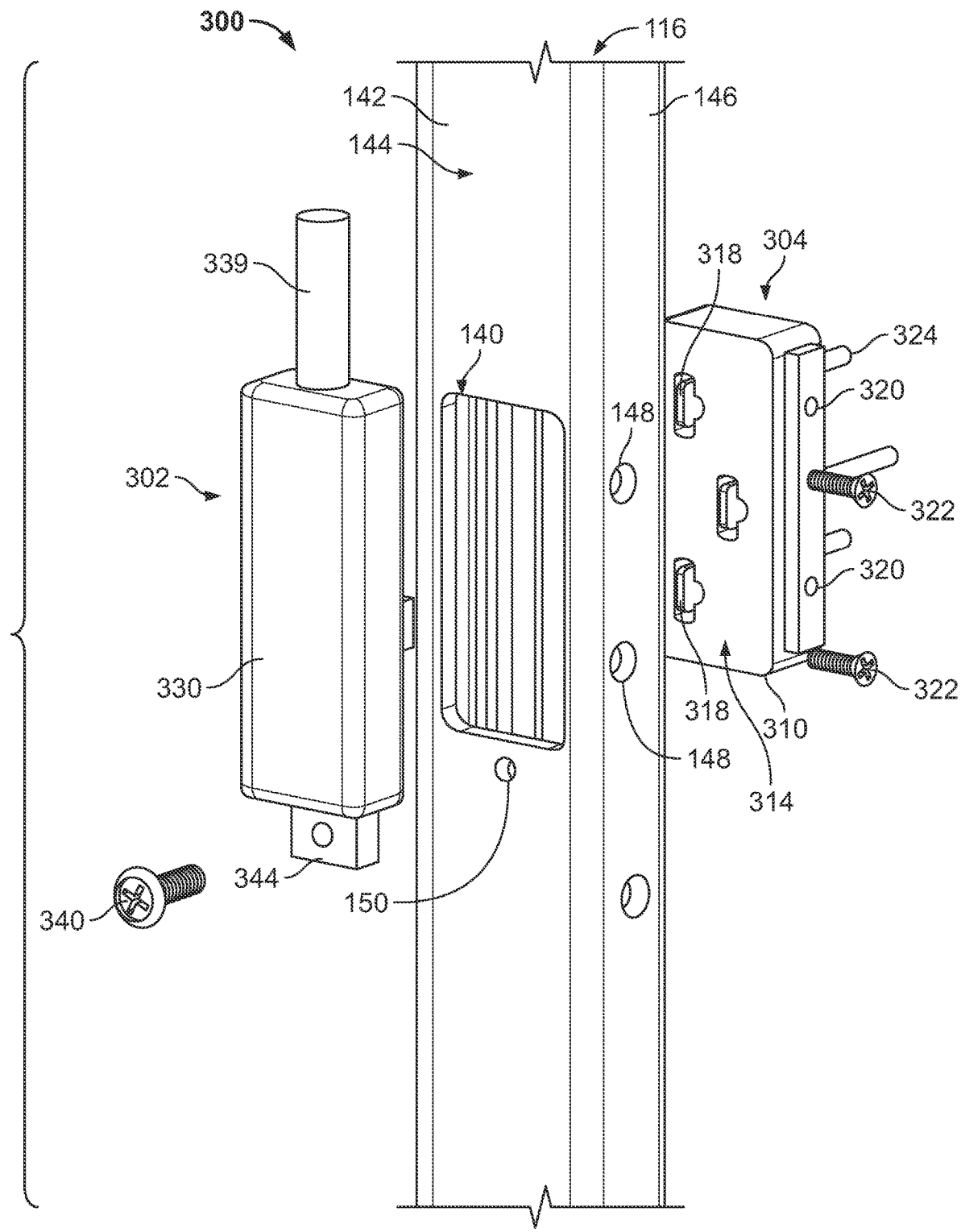
FIG. 4 depicts an exploded view of the door frame electrical connection.
Figure 5:
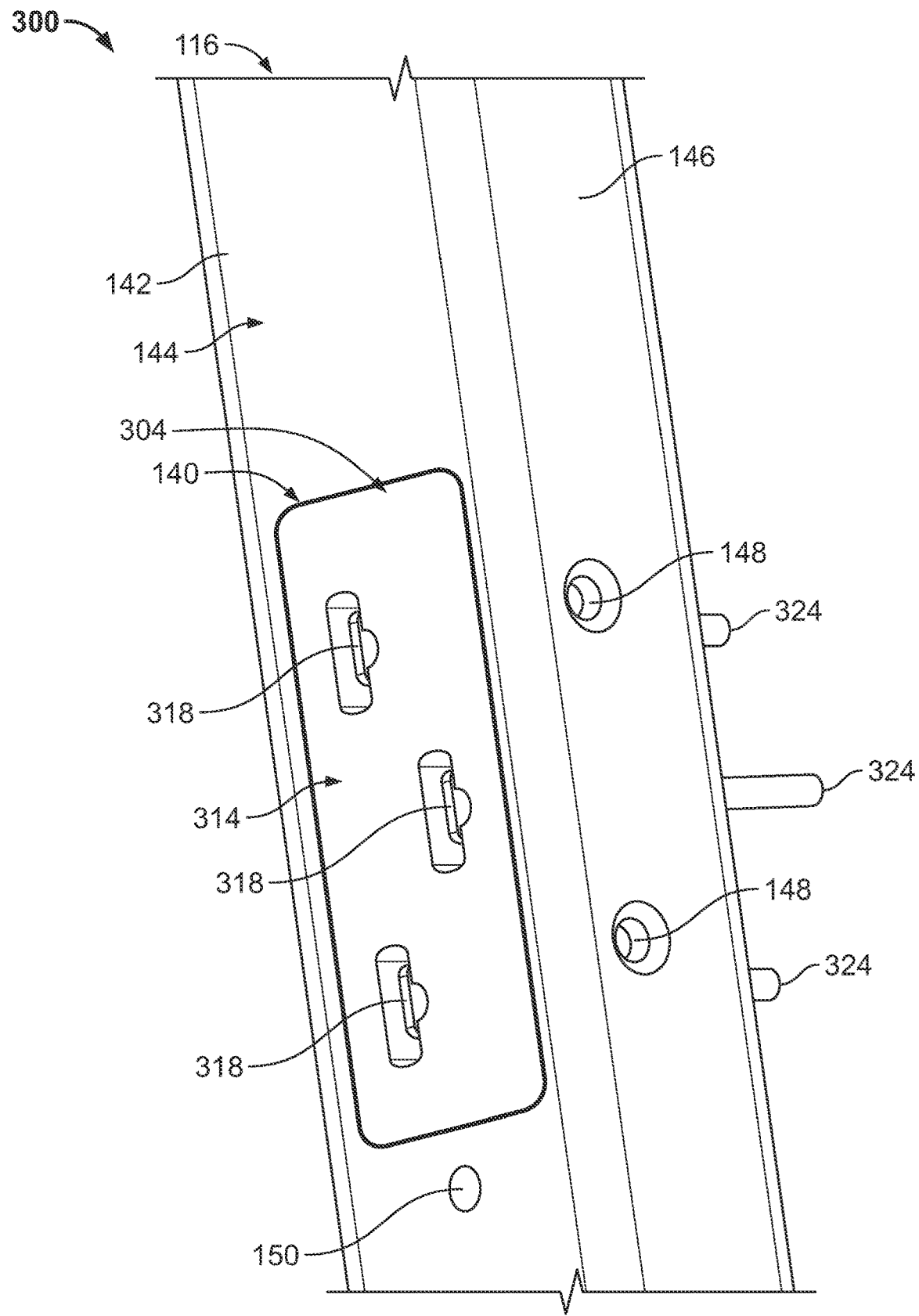
FIG. 5 depicts detailed view of an exemplary female electrical connector for the door frame electrical connection mounted to the door frame.
Figure 6:
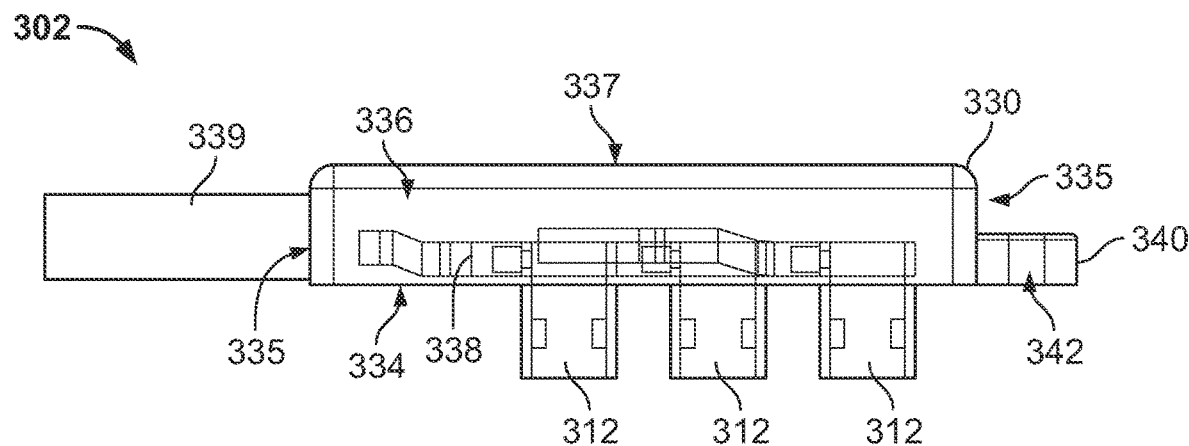
FIG. 6 depicts a side view of an exemplary male electrical connector.
Figure 7:
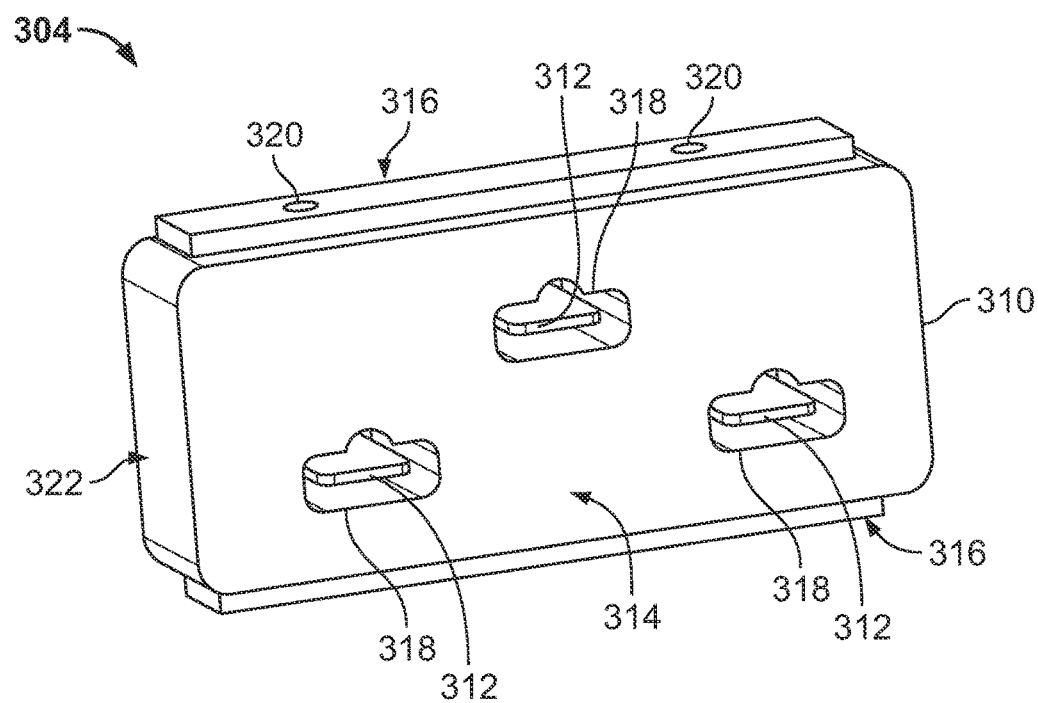
FIG. 7 depicts a perspective view of an exemplary female electrical connector.

FIGS. 1-2 show an exemplary refrigerated enclosure 100. Refrigerated enclosure 100 may be a refrigerator, freezer, or other enclosure defining a temperature-controlled space. In some implementations, refrigerated enclosure 100 is a refrigerated display case. For example, refrigerated enclosure 100 may be a refrigerated display case or refrigerated merchandiser in grocery stores, supermarkets, convenience stores, florist shops, and/or other commercial settings to store and display temperature-sensitive consumer goods (e.g., food products and the like). Refrigerated enclosure 100 can be used to display products that must be stored at relatively low temperatures and can include shelves, glass doors, and/or glass walls to permit viewing of the products supported by the shelves. In some implementations, refrigerated enclosure 100 is a refrigerated storage unit used, for example, in warehouses, restaurants, and lounges. Refrigerated enclosure 100 can be a free standing unit or "built in" unit that forms a part of the building in which refrigerated enclosure 100 is located.

Refrigerated enclosure 100 includes a body 102. Body 102 includes a top wall, a bottom wall, a left side wall, a right side wall, a rear wall (not shown), and a front portion defining a temperature-controlled space. Front portion 110 includes an opening into the temperature-controlled space. A case frame 114 is mounted at least partially within the opening.

Refrigerated enclosure 100 includes one or more doors 112 pivotally mounted on the case frame 114 by hinges 118. The example doors 112 illustrated in FIGS. 1 and 2 include door frames 116, panel assemblies 120, handles 122, and electrical connections 130. Panel assemblies 120 can provide insulation for the doors 112. Panel assemblies 120 can include, for example, one or more transparent panes of glass or plastic bounding internal spaces filled with insulating gas or vacuum spaces. Doors 112 can include heaters, lights, condensation control systems, and other electrical components that require power. Electrical connections 130 can be integrated into the door frames 116 to provide power for such electrical components.

Referring to FIG. 2, in some implementations, doors 112 include a video display 124 mounted to the door 112 or door frame 116. The video display 124 can be mounted over a panel assembly 120. A video display 124 mounted over a transparent panel assembly 120 would block a customer's view into the refrigerated enclosure 100. So, a planogram of the products contained behind the door 112 can be displayed on the video display 124 to inform a customer of the contents behind the door 112. Video displays 124 can be used to present advertising, product information (e.g., ingredients, nutrition information), and/or other graphical information to customers. In some implementations, video displays 1124 30 are mounted over non-transparent insulating panel assemblies, e.g., panel assemblies 120 that include a foam core. Electrical connections 130 can be used to supply power and/or data to the video displays 124 for doors 112 that have video displays 124.

FIGS. 3-7 illustrate electrical connection 130 in more detail. For example, electrical connection 130 can be implemented as a door frame electrical connection (DFEC) 300 that is mounted within a door frame 116 to supply electrical power or data signals to a display door 112. DFEC 300 includes a male electrical connector 302 and a female electrical connector 304. The female electrical connector 304 is mounted inside the door frame 116. For example, the female electrical connector 304 can be mounted on a hinge-side of the door 112 (see FIGS. 1 and 2). The male electrical connector 302 is shaped with a low profile of flattened shape to fit between doors 112 and/or between a door and a wall, mullion, or frame of the refrigerated enclosure 100 when the door 112 swings between open and closed positions. For example, the male electrical connector 302 has a thickness that is shorter than both its height and its width.

Female electrical connector 304 can include an over molded body 310 that houses female electrical terminals 312. Female electrical connector 304 has a front surface 314, side surfaces 315, 316, and a back surface (not shown). The front surface 314 has one or more holes 318 that are arranged to align with corresponding female electrical terminals 312. Side surfaces 315, 316 are tangential to the front surface 314. Female electrical connector 304 includes cables 324 extending out of the back surface. Each cable 324 is electrically connected to one of the female electrical terminals 312. The cables 324 can include electrical power and/or data cables.

The body 310 can be configured to match an inside profile of the door frame 116. For example, the body 310 can be shaped to fit within a U-shaped door frame 116 such that a the front surface 314 is exposed through an opening 140 in the edge 142 of the door frame 116. In some implementations, the female electrical connector 304 is shaped to fit within the door frame 116 such that the front surface 314 is flush or substantially flush with the outer surface 144 of the edge 142 of the door frame 116.

Side surfaces 316 can include one or more connection points 320 to connect the female electrical connector 304 to sidewalls 146 of the door frame 116. For example, connection points 320 can be configured to accept or connect with mechanical fasteners 322 (e.g., screws). In such implementations, the over molded body 310 can be sized to span an internal width of the door frame 116, such that side surfaces 316 contact internal surfaces of frame sidewalls 146. Frame sidewalls 146 include holes 148 that align with connection points 320 of the female electrical connector 304.

In some implementations, female electrical connector 304 houses two female electrical terminals 312 (e.g., power terminal and a neutral or ground terminal). In some implementations, female electrical connector 304 houses three female electrical terminals 312 (e.g., positive and negative power terminals and a neutral or ground terminal).

Male electrical connector 302 can include an over molded body 330 that houses male electrical terminals 332. Male electrical connector 302 has a front surface 334, side surfaces 335, 336, and a back surface 337. Front surface 334 has one or more male electrical terminals 332 extending outward from the surface. Wires 338 are housed within the over molded body 330 and connected to the male electrical terminals 332. A composite cable 339 (e.g., an SJ core jacketed cable) extends outward from one of the side surfaces (e.g. side surface 335).

In some implementations, male electrical connector 302 has a connection tab 340 extending outwards from one of the side surfaces (e.g., side surface 335). Connection tab has a hole 342 that aligns with a connection point 150 on the edge 142 of the door frame 116 that is configured to accept a mechanical fastener 344 to prevent the male electrical connector 302 from disconnecting from the female electrical connector 304 during operation of the door 112.

Figure 8:
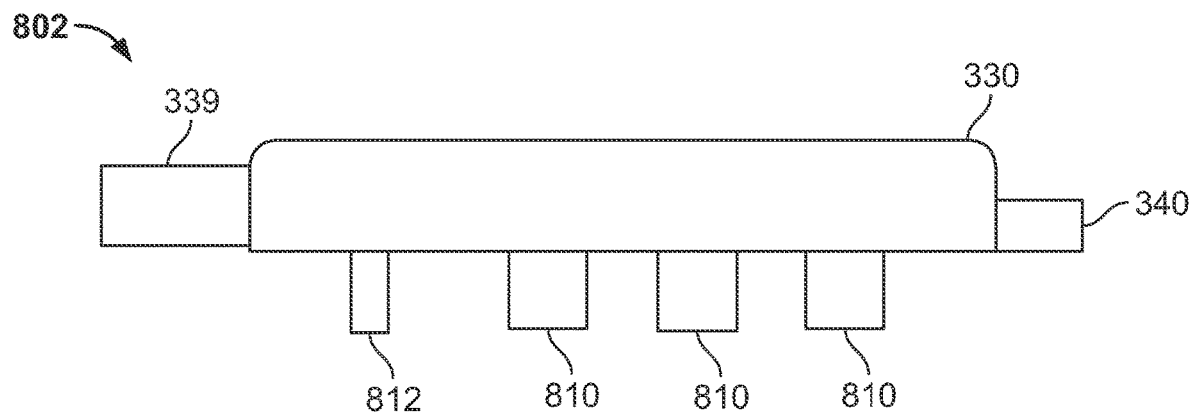
FIG. 8 depicts a front view of another exemplary male electrical connector.
Figure 9:
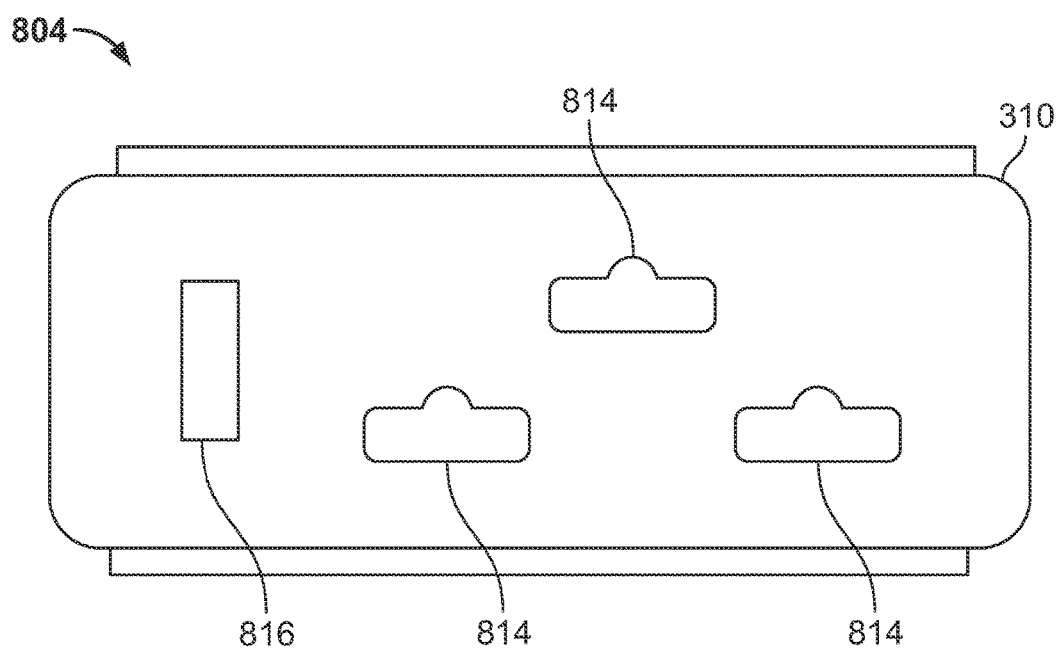
FIG. 9 depicts a front view of another exemplary female electrical connector.

FIG. 8 depicts a front view of another exemplary male electrical connector 802 and FIG. 9 depicts a front view of another exemplary female electrical connector 804. Male electrical connector 802 and female electrical connector 804 include both power and data connection terminals. For example, male electrical connector 802 includes three male power supply terminals 810 (e.g., positive and negative power terminals and a neutral or ground terminal) and a male data terminal 812. Female electrical connector 804 includes three female power supply terminals 814 (e.g., positive and negative power terminals and a neutral or ground terminal) and a female data terminal 816. Male and female data terminals 812, 816 can include, but are not limited to, Universal Serial Bus (USB) terminals, coaxial terminals, High Definition Multimedia Interface (HDMI) terminals, DisplayPort terminals, fiber optic cable terminals, or multiple data cable connections represent a combination of the types mentioned or other data connections.

Figure 10:
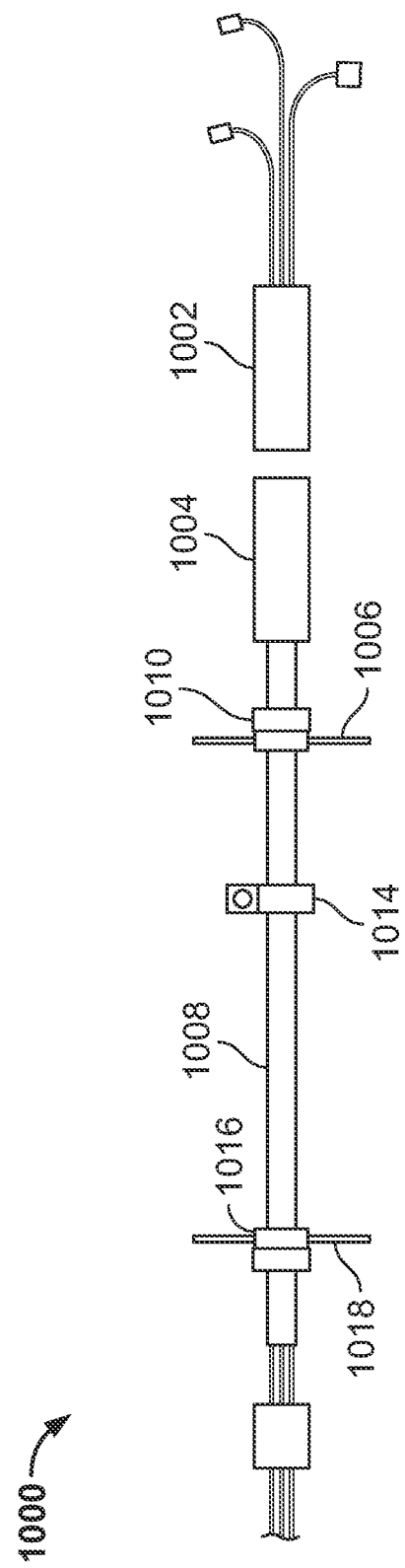
FIG. 10 depicts a block diagram of another implementation of a door frame electrical connection.
Figure 11:
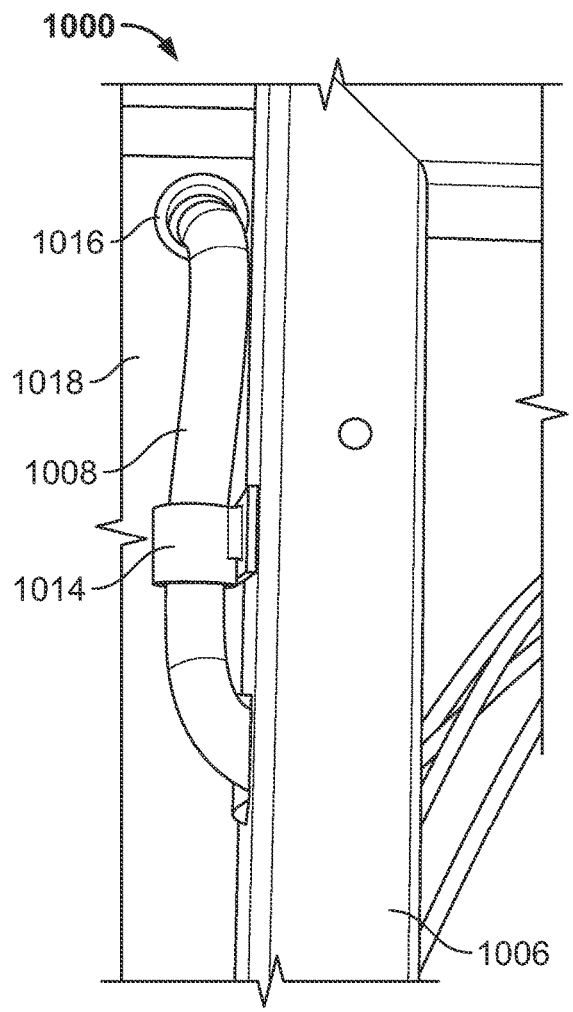
FIG. 11 depicts a front view of a door frame with the door frame electrical connection of FIG. 10.
Figure 12:
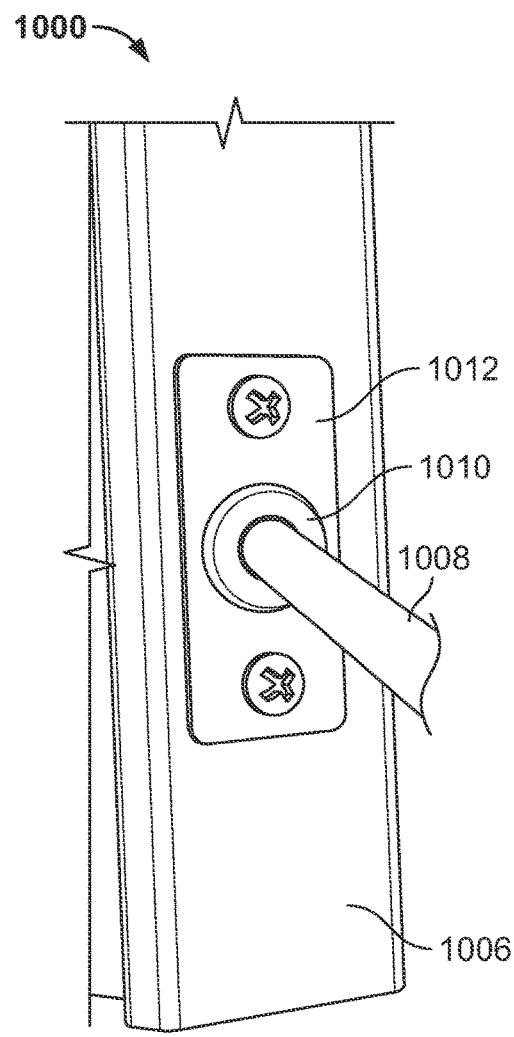
FIG. 12 depicts a side view of a door frame with the door frame electrical connection of FIG. 10.

FIG. 10 depicts a block diagram of another implementation of a door frame electrical connection. FIG. 11 depicts a front view of a door frame with the door frame electrical connection of FIG. 10, and FIG. 12 depicts a side view of a door frame with the door frame electrical connection of FIG. 10. The implementation depicted in FIGS. 10-12 is a DFEC 1000 with both the male and female electrical connectors 1002, 1004 disposed inside a door frame 1006. The male and female electrical connectors 1002, 1004 can be, e.g., a 4-pin connector disposed within a door raceway. One of the electrical connectors 1002, 1004 is connected to a composite electrical cable 1008 (e.g., an SJ cord). Electrical cable 1008 is passed through a grommet 1010 and steel 1012 cover on an outer surface of the door frame 1006. Electrical cable 1008 can be retained along the outer surface of the door frame 1006 using one or more cable holders 1014 to route the cable 1008 into alignment with a grommet 1016 on an outer wall or frame of the refrigerated display case 1018.

As used herein, the terms "perpendicular," "substantially perpendicular," or "approximately perpendicular" refer to an orientation of two elements (e.g., lines, axes, planes, surfaces, walls, or components) with respect to one and other that forms a ninety degree (perpendicular) angle within acceptable engineering, machining, or measurement tolerances. For example, two surfaces can be considered orthogonal to each other if the angle between the surfaces is within an acceptable tolerance of ninety degrees (e.g., ±1-5 degrees).

As used herein, the terms "aligned," "substantially aligned," "parallel," or "substantially parallel" refer to a relation between two elements (e.g., lines, axes, planes, surfaces, or components) as being oriented generally along the same direction within acceptable engineering, machining, drawing measurement, or part size tolerances such that the elements do not intersect or intersect at a minimal angle. For example, two surfaces can be considered aligned with each other if surfaces extend along the same general direction of a device.

As used herein, the terms "flush" or "substantially flush" refer to a relation between two elements (e.g., planes, surfaces, or components) as being oriented generally along the same general plane within acceptable engineering, machining, drawing measurement, or part size tolerances such that the elements or surfaces intersect with minimal surface variation between the two. For example, two surfaces can be considered flush with each other if surfaces extend along the same plane a device and there is minimal variation between the surfaces at their intersection, e.g., within acceptable engineering tolerances.

It should be noted that the orientation of various elements may differ according to other exemplary embodiments, and that such variations are intended to be encompassed by the present disclosure.

While a number of examples have been described for illustration purposes, the foregoing description is not intended to limit the scope of the invention, which is defined by the scope of the appended claims. There are and will be other examples and modifications within the scope of the following claims. For example, the construction and arrangement of the refrigerated case with thermal door frame as shown in the various exemplary embodiments is illustrative only. Although only a few embodiments of the present inventions have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the description and advantages of the subject matter disclosed herein. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present invention as defined in the appended claims. Other substitutions, modifications, changes and omissions may be made in the design, operating conditions and arrangement of the various exemplary embodiments without departing from the scope of the present inventions.

The invention claimed is:

1. A refrigerated display case comprising:
   a case frame comprising a hole defined in a surface of the case frame and a first grommet installed around an edge of the hole;
   an electrical cable extending through the first grommet and comprising an electrical connector disposed at one end of the electrical cable; and
   a door mounted in the case frame, the door comprising a door frame around at least a portion of the door, the door frame comprising an opening defined within a sidewall of the door frame at a hinge-side of the door, the opening comprising a second grommet and a steel cover installed around an edge of the opening,
   wherein the electrical cable passes through the second grommet and into the door frame, and
   wherein the door frame comprises a cable holder attached to an outer surface of the sidewall and spaced apart from the second grommet with the electrical cable secured to the sidewall by the cable holder.

2. The refrigerated display case of claim 1 wherein the electrical connector is at an end of the cable that is disposed within a raceway of the door frame.

3. The refrigerated display case of claim 2, wherein the electrical connector is a female connector.

4. The refrigerated display case of claim 3, wherein the electrical connector is a 4-pin female connector.

5. The refrigerated display case of claim 3 comprising a male electrical connector disposed within the door frame and coupled to the female connector, wherein the male electrical connector is connected to stranded wires that provide electrical power to one or more components of the door.

6. The refrigerated display case of claim 2 comprising a second, corresponding, electrical connector coupled to the electrical connector and disposed within the door frame, wherein the second electrical connector is connected to stranded wires that provide electrical power to one or more components of the door.

7. The refrigerated display case of claim 1, wherein the electrical cable is an SJ cord.

* * * * *